(12) United States Patent
Kim et al.

(10) Patent No.: US 7,615,803 B2
(45) Date of Patent: Nov. 10, 2009

(54) METHOD FOR MANUFACTURING TRANSISTOR AND IMAGE DISPLAY DEVICE USING THE SAME

(75) Inventors: Keum-Nam Kim, Suwon-si (KR); Ul-Ho Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/707,975

(22) Filed: Feb. 15, 2007

(65) Prior Publication Data

US 2007/0138504 A1    Jun. 21, 2007

Related U.S. Application Data

(62) Division of application No. 10/982,429, filed on Nov. 5, 2004, now Pat. No. 7,199,406.

(30) Foreign Application Priority Data

Nov. 24, 2003   (KR)   .................. 10-2003-0083586

(51) Int. Cl.
*H01L 31/0328* (2006.01)
*H01L 31/0392* (2006.01)
*H01L 27/01* (2006.01)
*H01L 27/12* (2006.01)
*H01L 29/76* (2006.01)

(52) U.S. Cl. .................. 257/184; 257/347; 257/331; 257/412

(58) Field of Classification Search .......... 257/184, 257/347, 349, 57, 67, 291, 292, 443, 655, 257/249, 331, 412; 438/149
See application file for complete search history.

(56) References Cited

U.S. PATENT DOCUMENTS

| 4,528,480 | A | 7/1985 | Unagami et al. |
| 5,608,245 | A | 3/1997 | Martin |
| 6,323,072 | B1 * | 11/2001 | Yamazaki et al. ........... 438/166 |

(Continued)

FOREIGN PATENT DOCUMENTS

CN    1258367 A    6/2000

(Continued)

OTHER PUBLICATIONS

European Search Report for application No. 04090457.5, dated Mar. 11, 2005, in the name of Samsung SDI Co., Ltd.

(Continued)

*Primary Examiner*—Chuong A. Luu
(74) *Attorney, Agent, or Firm*—Christie, Parker & Hale, LLP

(57) ABSTRACT

A method for manufacturing a transistor includes forming a semiconductor layer on a substrate, a first insulation film on the semiconductor layer, and a gate electrode on the first insulation film. The method also includes forming a source region, a channel region, and a drain region in the semiconductor layer and forming a second insulation film on the gate electrode. A source electrode and a drain electrode are formed on the second insulation film and are coupled to the source region and the drain region, respectively. The method further includes coupling the drain electrode to the gate electrode through a contact hole that is vertically above the channel region.

12 Claims, 4 Drawing Sheets

U.S. PATENT DOCUMENTS

| | | | |
|---|---|---|---|
| 6,362,798 B1 | 3/2002 | Kimura et al. | |
| 6,599,785 B2 * | 7/2003 | Hamada et al. | 438/151 |
| 6,737,306 B2 | 5/2004 | Yamazaki et al. | |
| 6,979,603 B2 | 12/2005 | Hamada et al. | |
| 7,081,379 B2 * | 7/2006 | Hanson et al. | 438/199 |
| 7,176,520 B2 * | 2/2007 | Miyake et al. | 257/327 |
| 7,456,056 B2 * | 11/2008 | Yamazaki et al. | 438/156 |
| 2002/0094675 A1 | 7/2002 | Kerr et al. | |
| 2002/0115245 A1 | 8/2002 | Chang et al. | |

FOREIGN PATENT DOCUMENTS

| | | |
|---|---|---|
| EP | 1197943 | 4/2002 |
| JP | 58-115864 | 7/1983 |
| JP | 61-105870 | 5/1986 |
| JP | 2-246160 | 10/1990 |
| JP | 11-272233 | 10/1999 |
| JP | 2003-202833 | 7/2003 |

OTHER PUBLICATIONS

European Patent Office Patent Abstracts of Japan for Publication No. 02246160, publication date Oct. 1, 1990, in the name of Emoto Fumiaki.

European Patent Office Patent Abstracts of Japan for Publication No. 61105870, publication date May 23, 1986, in the name of Oshima Hiroyuki.

European Search Report for application No. 04090457.5, dated Jun. 14, 2005, in the name of Samsung SDI Co., Ltd.

* cited by examiner

METHOD FOR MANUFACTURING TRANSISTOR AND IMAGE DISPLAY DEVICE USING THE SAME

CROSS REFERENCE TO RELATED APPLICATION

This application is a divisional application of U.S. patent application Ser. No. 10/982,429, filed on Nov. 5, 2004 now U.S. Pat. No. 7,199,406 which claims priority to and the benefit of Korea Patent Application No. 2003-83586 filed on Nov. 24, 2003 in the Korean Intellectual Property Office, the entire content of which is incorporated herein by reference.

BACKGROUND (a) Field

The present invention relates to a display device. More specifically, the present invention relates to a method for improving an aperture ratio of an organic EL (electroluminescent) display device.

(b) Description of the Related Art

In general, an organic EL display electrically excites a phosphorous organic compound to emit light, and it voltage- or current-drives N×M organic emitting cells to display images. An organic emitting cell includes an anode, such as indium tin oxide (ITO), an organic thin film, and a cathode layer (metal). The organic thin film has a multi-layer structure including an emitting layer (EML), an electron transport layer (ETL), and a hole transport layer (HTL) for maintaining balance between electrons and holes and improving emitting efficiencies. It further includes an electron injecting layer (EIL) and a hole injecting layer (HIL).

Methods for driving the organic emitting cells include a passive matrix method, and an active matrix method using thin film transistors (TFTs). In the passive matrix method, cathodes and anodes cross (i.e., cross over or intersect with) each other, and lines are selectively driven. On the other hand, in the active matrix method, a TFT is coupled to each ITO pixel electrode to thereby maintain the voltage by capacitance of a capacitor. The active matrix method is classified as a voltage programming method or a current programming method according to signal forms supplied for programming a voltage in the capacitor.

It is difficult for the conventional voltage-programming pixel circuit to obtain high gray scales due to the threshold voltage ($V_{TH}$) of a TFT and the deviation of the mobility of carriers caused by non-uniformity of the manufacturing process. For example, when a TFT is driven by a voltage of 3 volts (3V), the voltage is applied to a gate of the TFT at intervals of less than 12 mV (=3V/256) in order to represent 8-bit (256) gray scales. Therefore, for example, if the deviation of the threshold voltage of the TFT is 100 mV because of non-uniformity of a manufacturing process, it becomes difficult to represent the high gray scales.

In order to compensate for the deviation of the threshold voltage of the TFT, a diode-connected compensation transistor is conventionally coupled to the gate of a driving transistor.

The diode-connected transistor represents a transistor which substantially performs the same operation as that of the diode, and indicates a transistor having a gate and a drain which are coupled to each other as shown in FIGS. 1A and 1B.

FIG. 2 shows a plane view of a conventional diode-connected transistor, and FIG. 3 shows a cross-sectional view of FIG. 2 with respect to the reference of A-B.

As shown in FIGS. 2 and 3, a conventional diode-connected transistor includes a passivation layer 80, a drain electrode 32 contacting a drain region 31, a source electrode 22 contacting a source region 21, and a gate electrode 10. The drain electrode 32 is extended to reach the gate electrode 10, and the gate electrode 10 and the drain electrode 32 are coupled through a contact hole 72 in a second insulation film 70. This method reduces the aperture ratio of the organic EL display device since the area occupied by the diode-connected transistor is enlarged.

SUMMARY

In one embodiment of the present invention, a method for manufacturing a transistor includes: forming a semiconductor layer on a substrate; forming a first insulation film on the semiconductor layer; forming a gate electrode on the first insulation film; forming a source region, a channel region, and a drain region in the semiconductor layer; forming a second insulation film on the gate electrode; forming a source electrode and a drain electrode on the second insulation film to project through the first and second insulation films so that the source electrode and the drain electrode are coupled to the source region and the drain region respectively; and coupling the drain electrode to the gate electrode through a contact hole in the insulation film, wherein the contact hole is formed above the channel region.

In another embodiment of the present invention, a method for manufacturing a transistor includes: forming a semiconductor layer on a substrate; forming a first insulation film on the semiconductor layer; forming a gate electrode on the first insulation film; forming a source region, a channel region, and a drain region in the semiconductor layer; forming a second insulation film on the gate electrode; forming a source electrode and a drain electrode on the second insulation film to project through the first and second insulation films so that the source electrode and the drain electrode are coupled to the source region and the drain region, respectively. The drain electrode covers at least part of the channel region and the drain electrode and the gate electrode are coupled through a contact hole.

In yet another embodiment of the present invention, an image display device includes a plurality of data lines for transmitting data currents for display of image signals, a plurality of scan lines for transmitting select signals, and a plurality of pixel circuits formed at a plurality of pixels defined by the data lines and the scan lines, wherein the pixel circuit includes: a first transistor having a first electrode and a second electrode, having a capacitor between the first and second electrodes, the first transistor outputting a current which corresponds to a voltage, applied between the first and second electrodes, to a third electrode. A display element is coupled to the third electrode of the first transistor for displaying an image in correspondence to an amount of the applied current. A second transistor is also provided and has a first electrode coupled to the first electrode of the first transistor, a second electrode, and a third electrode. The second transistor is diode-connected. The image display system also includes a switch for transmitting a voltage applied to the data line to the second transistor in response to a select signal applied to the scan line. In this embodiment, the third electrode of the second transistor is coupled to the first electrode of the second transistor through a contact hole, and the contact hole is above a channel in a semiconductor layer.

In still yet another embodiment of the present invention, in a method for manufacturing an image display device including a pixel region for forming a pixel circuit and a driving region for driving the pixel circuit wherein the pixel circuit includes a transistor, a method for manufacturing the transistor includes: forming a semiconductor layer on a substrate, the semiconductor layer having a source region, a channel region and a drain region; forming a gate electrode with a gate insulation film, the gate electrode and the gate insulation film at least partially covering the channel region; forming an inter-layer insulation film on the gate electrode; forming a source electrode and a drain electrode on the inter-layer insulation film and coupling the source electrode and the drain electrode to the source region and the drain region, respectively. This embodiment also includes positioning the drain electrode to cover part of the inter-layer insulation film above at least part of the channel region, and coupling the drain electrode to the gate electrode through a contact hole in the inter-layer insulation film.

DETAILED DESCRIPTION

Figure 1A:
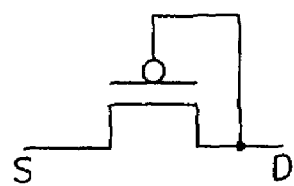
FIG. 1A shows a conventional diode-connected PMOS transistor.
Figure 1B:
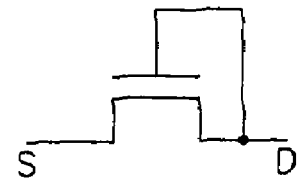
FIG. 1B shows a conventional diode-connected NMOS transistor.
Figure 2:
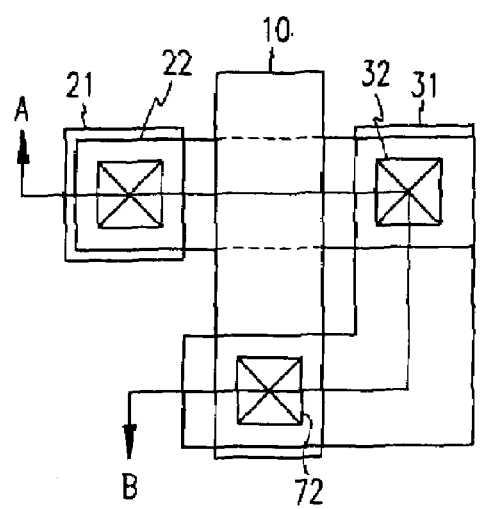
FIG. 2 shows a plane view of the diode-connected transistors of FIGS. 1A and 1B.
Figure 3:
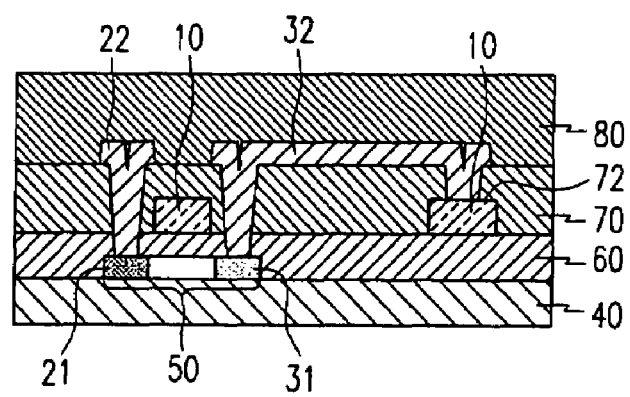
FIG. 3 shows a cross-sectional view along the line A-B of the diode connected transistor of FIG. 2.
Figure 4:
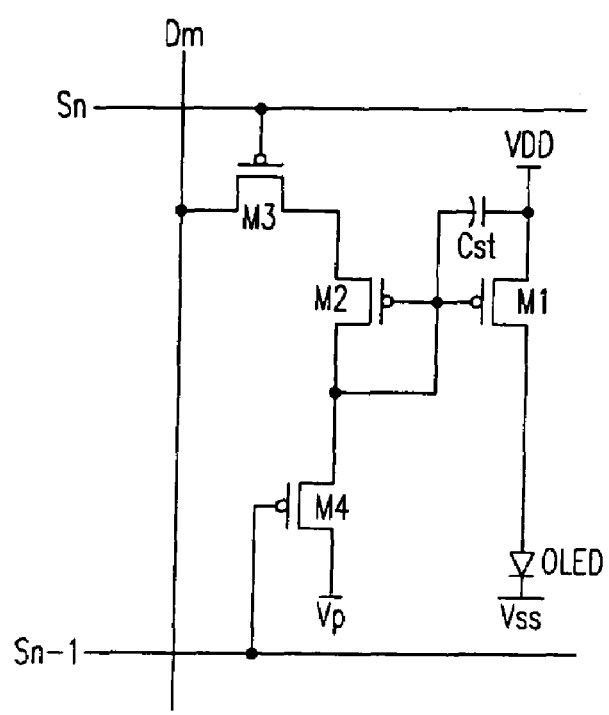
FIG. 4 shows a pixel circuit of an organic EL display device.

As shown in FIG. 4, a pixel circuit of an organic EL display device includes a driving transistor M1, a compensation transistor M2, switching transistors M3 and M4, a capacitor Cst, and an organic EL element OLED.

The driving transistor M1 controls the current flowing to the organic EL element OLED, and has a source coupled to a power VDD and a drain coupled to the organic EL element.

The compensation transistor M2 compensates for the deviation of the threshold voltage of the driving transistor M1, and has a gate coupled to the gate of the driving transistor M1. In this embodiment, the compensation transistor M2 is diode-connected.

The switching transistor M3 transmits a voltage from the data line Dm to the compensation transistor M2 in response to a select signal provided by the scan line Sn, and the switching transistor M4 transmits a precharge voltage Vp to the compensation transistor M2 in response to a select signal provided by a previous scan line Sn−1.

The capacitor Cst is coupled between the gate and the source of the driving transistor M1, and maintains the gate-source voltage of the driving transistor M1 at a constant voltage.

Figure 5:
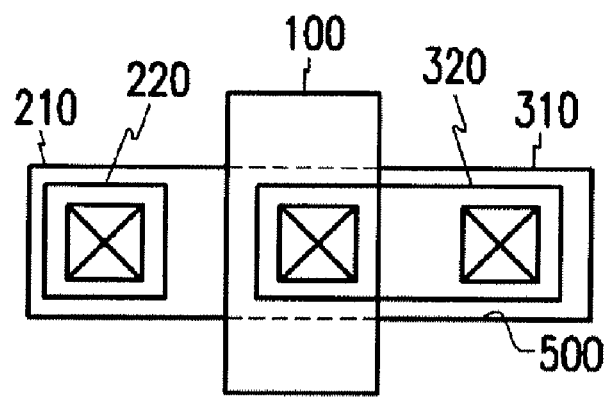
FIG. 5 shows a plane view of a compensation transistor according to an exemplary embodiment of the present invention.
Figure 6:
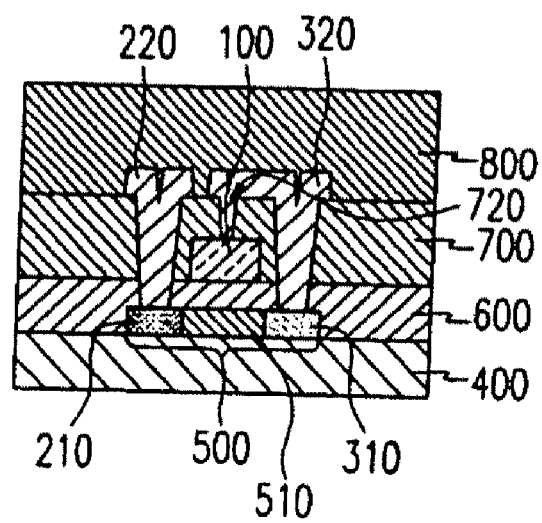
FIG. 6 shows a cross-sectional view of the compensation transistor according to an exemplary embodiment of the present invention.

Referring to FIGS. 5 and 6, a method for manufacturing the compensation transistor M2 according to an exemplary embodiment of the present invention will be described.

FIG. 5 shows a plane view of the compensation transistor M2 according to an exemplary embodiment of the present invention, and FIG. 6 shows a cross-sectional view of the compensation transistor M2 according to an exemplary embodiment of the present invention.

As shown in FIGS. 5 and 6, a gate electrode 100 of the compensation transistor M2 and a drain electrode 320 are coupled by forming a contact hole 720, aligned with the gate electrode 100, in a second insulation film 700. A passivation layer 800 is formed above the second insulation film 700.

In detail, as shown in FIG. 6, a semiconductor layer 500 made of such as polycrystalline silicone layer is formed on a transparent insulation substrate 400, and a first insulation film 600 made of $SiO_2$ or $SiN_x$ is formed on the semiconductor layer 500.

The gate electrode 100 made of Al or Cr is formed on the first insulation film 600 so that the gate electrode 100 may cross the semiconductor layer 500.

The semiconductor layer 500 is doped with p-type dopant, excluding a region below the gate electrode 100. Regions doped with the dopant respectively form a source region 210 and a drain region 310, and an undoped region forms a channel region 510.

A source electrode 220 is formed on the source region 210, and the drain electrode 320 is formed on the drain region 310.

The drain electrode 320 contacts the gate electrode 100 so that the drain electrode 320 may cover part of the channel region 510 of the transistor M2, and the drain electrode 320 is coupled to the gate electrode 100 through a contact hole 720. In this embodiment, the contact hole 720 is above the channel 510 (i.e., covering, overlapping, or aligned in a vertical direction with the channel, with or without intervening elements therebetween).

Accordingly, the area occupied by the diode-connected transistor M2 is reduced, and the aperture ratio of the organic EL display device is improved.

Figure 7:
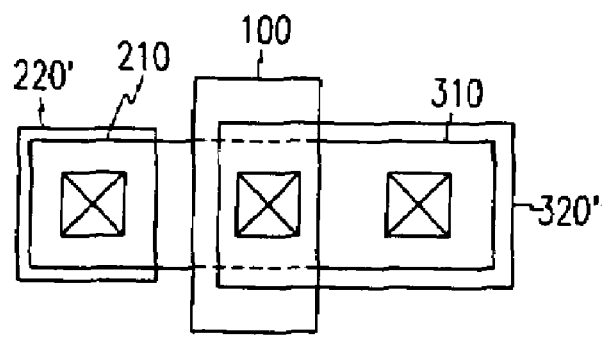
FIG. 7 shows a plane view of a compensation transistor according to another exemplary embodiment of the present invention.

Widths of the source and drain regions 210 and 310 are illustrated to be formed wider than those of the source and drain electrodes 220 and 320 in FIG. 5. Alternatively, as shown in FIG. 7, widths of the source and drain electrodes 220' and 320' can be formed much wider than areas of the source and drain regions 210 and 310.

The compensation transistor M2 of FIG. 5 is shown with a P channel transistor. Alternatively, the driving transistor M1 and the compensation transistor M2 can be N channel transistors. In this alternative embodiment (not shown), the drain electrode is formed to cover part of the channel area, and a contact hole for coupling the drain electrode and the gate electrode is formed above the channel of the transistor.

Figure 8:
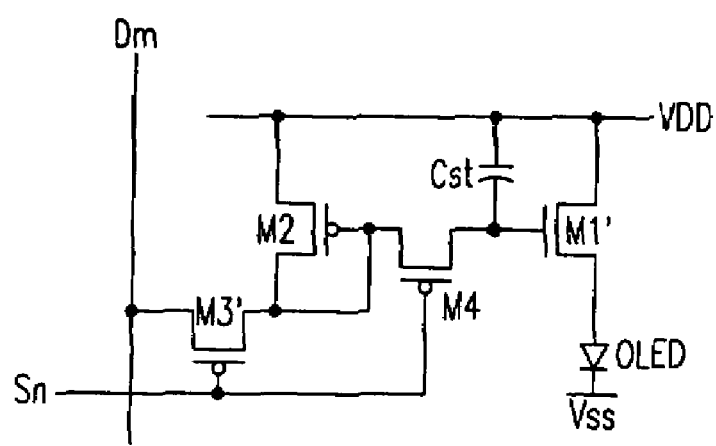
FIG. 8 shows another pixel circuit of an organic EL display device.

A diode-connected transistor has been shown as the compensation transistor in the voltage programming pixel circuit embodiments described above. However, a diode-connected transistor M3' can also be used for the current programming pixel circuit as shown in FIG. 8. FIG. 8 shows first, second, third and fourth transistors M1', M2, M3' and M4, an organic element OLED and a capacitor Cst. Since the current programming pixel circuit is well known to a person skilled in the art, no corresponding description will be provided.

Further, the manufacturing method is applicable to circuits which use diode-connected transistors as well as the organic EL display device.

Although exemplary embodiments of the present invention have been described in detail hereinabove, it should be clearly understood that many variations and/or modifications of the basic inventive concept taught herein, which may appear to those skilled in the art, will still fall within the spirit and scope of the present invention, as defined in the appended claims, and equivalents thereof.

What is claimed is:

1. A transistor, comprising:
a polycrystalline silicon semiconductor layer on a substrate, the semiconductor layer having a source region and a channel-and-drain region, the channel-and-drain region having a channel region and a drain region;
a first insulation film on the semiconductor layer;
a gate electrode on the first insulation film on the channel region of the semiconductor layer;
a second insulation film on the gate electrode;
a source electrode and a drain electrode on the second insulation film to project through the first insulation film and the second insulation film so that the source electrode and the drain electrode are coupled to the source region and the drain region respectively, the drain electrode covering at least part of the channel region; and
a contact hole in the second insulation film above the channel region, the contact hole coupling the drain electrode and the gate electrode,
wherein such coupling with the gate electrode is over the channel region.

2. The transistor of claim 1, wherein lengths and widths of the source region, the channel-and-drain region, or both are longer and wider than respective lengths and widths of the source electrode, the drain electrode, or both.

3. The transistor of claim 1, wherein lengths and widths of the source region, the drain region, or both are shorter and narrower than respective lengths and widths of the source electrode, the drain electrode, or both.

4. A transistor, comprising:
a polycrystalline silicon semiconductor layer on a substrate, the semiconductor layer having a source region, a channel region and a drain region;
a first insulation film on the semiconductor layer;
a gate electrode on the first insulation film on the channel region of the semiconductor layer;
a second insulation film on the gate electrode;
a source electrode and a drain electrode on the second insulation film to project through the first insulation film and the second insulation film so that the source electrode and the drain electrode are coupled to the source region and the drain region respectively, one of the drain electrode or the source electrode covering at least part of the channel region; and
a contact hole coupling the one of the drain electrode or the source electrode covering the at least part of the channel region and the gate electrode,
wherein such coupling with the gate electrode is over the channel region.

5. The transistor of claim 4, wherein lengths and widths of the source region, the drain region, or both are longer and wider than respective lengths and widths of the source electrode, the drain electrode, or both.

6. The transistor of claim 4, wherein lengths and widths of the source region, the drain region, or both are shorter and narrower than respective lengths and widths of the source electrode, the drain electrode, or both.

7. A transistor, comprising:
a polycrystalline silicon semiconductor layer on a substrate, the semiconductor layer having a source-and-channel region and a drain region, the source-and-channel region having a source region and a channel region;
a first insulation film on the semiconductor layer;
a gate electrode on the first insulation film on the channel region of the semiconductor layer;
a second insulation film on the gate electrode;
a source electrode and a drain electrode on the second insulation film to project through the first insulation film and the second insulation film so that the source electrode and the drain electrode are coupled to the source region and the drain region respectively, the source electrode covering at least part of the channel region; and
a contact hole in the second insulation film above the channel region, the contact hole coupling the source electrode and the gate electrode,
wherein such coupling with the gate electrode is over the channel region.

8. The transistor of claim 7, wherein lengths and widths of the source-and-channel region, the drain region, or both are longer and wider than respective lengths and widths of the source electrode, the drain electrode, or both.

9. The transistor of claim 7, wherein lengths and widths of the source region, the drain region, or both are shorter and narrower than respective lengths and widths of the source electrode, the drain electrode, or both.

10. The transistor of claim 1, wherein the substrate is a transparent insulation substrate.

11. The transistor of claim 4, wherein the substrate is a transparent insulation substrate.

12. The transistor of claim 7, wherein the substrate is a transparent insulation substrate.

* * * * *